(12) United States Patent
Shin

(10) Patent No.: US 7,518,578 B2
(45) Date of Patent: Apr. 14, 2009

(54) DEMULTIPLEXER AND DISPLAY DEVICE USING THE SAME

(75) Inventor: Dong-Yong Shin, Suwon-si (KR)

(73) Assignee: Samsung SDI Co., Ltd. (KR)

( * ) Notice: Subject to any disclaimer, the term of this patent is extended or adjusted under 35 U.S.C. 154(b) by 588 days.

(21) Appl. No.: 10/955,171

(22) Filed: Sep. 29, 2004

(65) Prior Publication Data

US 2005/0100057 A1 May 12, 2005

(30) Foreign Application Priority Data

Nov. 10, 2003 (KR) .................. 10-2003-0079087

(51) Int. Cl.
*G09G 3/30* (2006.01)

(52) U.S. Cl. .................. 345/76; 345/100; 327/241

(58) Field of Classification Search ............ 345/76–102
See application file for complete search history.

(56) References Cited

U.S. PATENT DOCUMENTS

| | | | | |
|---|---|---|---|---|
| 5,061,920 A | * | 10/1991 | Nelson | 345/89 |
| 5,091,722 A | * | 2/1992 | Kitajima et al. | 345/89 |
| 5,335,023 A | * | 8/1994 | Edwards | 348/800 |
| 5,903,250 A | | 5/1999 | Lee et al. | |
| 5,963,158 A | | 10/1999 | Yasuda | |
| 7,180,497 B2 | * | 2/2007 | Lee et al. | 345/98 |
| 7,180,685 B2 | * | 2/2007 | Wang et al. | 359/717 |
| 7,193,619 B2 | | 3/2007 | Kimura | |
| 2004/0125067 A1 | * | 7/2004 | Kim et al. | 345/98 |
| 2006/0119552 A1 | | 6/2006 | Yumoto | |

FOREIGN PATENT DOCUMENTS

| | | |
|---|---|---|
| CN | 1199213(A) | 11/1998 |
| CN | 1432989(A) | 7/2003 |
| JP | 2000-039926 | 2/2000 |
| JP | 2003-150112 | 5/2003 |
| JP | 2004-29528 | 1/2004 |
| WO | WO 02/39420 A1 | 5/2002 |
| WO | WO 03/038796 A1 | 5/2003 |

OTHER PUBLICATIONS

Patent Abstracts of Japan, Publication No. 2003-150112, dated May 23, 2003, in the name of Masuyuki Ota.
Patent Abstracts of Japan, Publication No. 2004029528, dated Jan. 29, 2004, in the name of Reiji Hatsutori.
Patent Abstracts of Japan, Publication No. 2000-039926, published on Feb. 8, 2000 in the name of Shirai.

* cited by examiner

*Primary Examiner*—Duc Q Dinh
(74) *Attorney, Agent, or Firm*—Christie, Parker & Hale, LLP

(57) ABSTRACT

A display device includes a demultiplexer. The demultiplexer programs time-divided and sequentially input data currents to at least two signal lines. The demultiplexer includes first and second sample/hold circuits for alternately sampling data currents and holding sampled data corresponding to the sampled data, and third and fourth sample/hold circuits for respectively sampling the sampled data held by the first and second sample/hold circuits and programming the current which correspond to the sampled data to the two signal lines.

10 Claims, 6 Drawing Sheets

DEMULTIPLEXER AND DISPLAY DEVICE USING THE SAME

CROSS REFERENCE TO RELATED APPLICATION

This application claims priority to and the benefit of Korea Patent Application No. 2003-79087 filed on Nov. 10, 2003 in the Korean Intellectual Property Office, the entire content of which is incorporated herein by reference.

BACKGROUND OF THE INVENTION (a) Field of the Invention

The present invention relates to a display device. More specifically, the present invention relates to a demultiplexer for demultiplexing the data current in a display device.

(b) Description of the Related Art

FIG. 1 shows an active matrix organic light emitting diode (AMOLED) display device as an example of a current driven display device which needs current demultiplexing. Exemplary embodiments of the present invention can be applied to the AMOLED display device of FIG. 1, as well as other suitable current driven display devices.

The current driven display device of FIG. 1 includes an organic electroluminescent (EL) display panel 100, a data driver 200 for providing a data current, a current demultiplexer 300 for performing a 1:N ratio demultiplexing on the data current, and scan drivers 400 and 500 for sequentially selecting a plurality of scan lines.

A predetermined data current is applied to pixels 10 belonging to scan lines selected by the scan drivers 400 and 500, and the pixels 10 display colors corresponding to the data current. The current demultiplexer 300 is used to reduce the number of ICs (integrated circuits) of the data driver 200. That is, the current provided by the data driver 200 is 1:N-demultiplexed by the demultiplex unit 300, and is applied to the pixels corresponding to the N data lines. Usage of the current demultiplexer 300 reduces the number of ICs necessary for the data driver and saves purchase costs.

FIG. 2 shows a conventional analog switch for a demultiplexer.

The 1:2 demultiplexer shown in FIG. 2 alternately turns on and off the switches S1 and S2 to thereby output the data current to two data lines. A long time is required to program the data to the pixels 10 in order to realize high resolution in the current driven panel. Therefore, a problem with reducing the number of ICs of the data driver is that the data programming time needs to be reduced because the data are to be programmed to the pixels each time the switches are alternately turned on and off. Thus, the conventional demultiplexer is not suitable for high-resolution display devices that require a long data programming time.

SUMMARY OF THE INVENTION

It is an aspect of the present invention to provide a demultiplexing device and method for reducing the number of ICs of the data driver without substantially reducing the data programming time.

It is another aspect of the present invention to provide a demultiplexing device and method appropriate for high-resolution display devices.

In one exemplary embodiment according to the present invention, a demultiplexer for programming time-divided and sequentially input data currents to at least two signal lines is provided. The demultiplexer includes first and second sample/hold circuits for sequentially sampling data currents corresponding to data and holding the data currents; and third and fourth sample/hold circuits for respectively sampling the currents held by the first and second sample/hold circuits. The third and fourth sample/hold circuits program currents which correspond to the data to the two signal lines, respectively.

The first and second sample/hold circuits may hold the currents which correspond to the sampled data with substantially similar timing, and the third and fourth sample/hold circuits may program the currents which correspond to the sampled data to the signal lines with substantially similar timing.

The third and fourth sample/hold circuits may program currents previously held by the first and second sample circuits to the signal lines while the first and second sample/hold circuits sequentially sample the data currents.

Each of the first second, third, and fourth sample/hold circuits may include a sampling switch that is turned off at a sampling operation and a holding switch that is turned off at a holding operation.

The holding switch of the first sample/hold circuit and the sampling switch of the third sample/hold circuit may be formed as a single shared switch.

The holding switch of the second sample/hold circuit and the sampling switch of the fourth sample/hold circuit may be formed as a single shared switch.

In another exemplary embodiment of the present invention, a display device including a plurality of data lines for transmitting image signals, a plurality of scan lines for transmitting select signals, and a plurality of pixel circuits coupled to the data lines and the scan lines is provided. The display device includes a data driver for supplying a data current corresponding to the image signal, a demultiplexer for demultiplexing the data current supplied by the data driver and outputting the demultiplexed data current to the data lines, and a scan driver for supplying the select signals to the scan lines. The demultiplexer includes first, second, third, and fourth sample/hold circuits. Each of the sample/hold circuits includes a sampling switch, a data storage unit, and a holding switch. The first and second sample/hold circuits are coupled to the data driver through their sampling switches and coupled to the third and fourth sample/hold circuits through their holding switches. The third and fourth sample/hold circuits are coupled to the first and second sample/hold circuits through their sampling switches, and coupled to the data lines through their holding switches.

In still another exemplary embodiment of the present invention, a demultiplexing method for outputting a first data current which is time-divided and sequentially input to at least two signal lines is provided. The method includes allowing at least two sample/hold circuits to sequentially sample the first data current and storing the sampled first data current as a first data voltage. In addition, the method includes holding a second data current which corresponds to the first data voltage, allowing at least two sample/hold circuits to sample the second data current with substantially identical timing, and storing the sampled second data current as a second data voltage. The method then outputs a third data current corresponding to the second data voltage to the signal lines.

A more complete understanding of the demultiplexer and display device using the same will be afforded to those skilled in the art, as well as a realization of additional advantages and objects thereof, by a consideration of the following detailed description. Reference will be made to the appended sheets of drawings which will first be described briefly.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
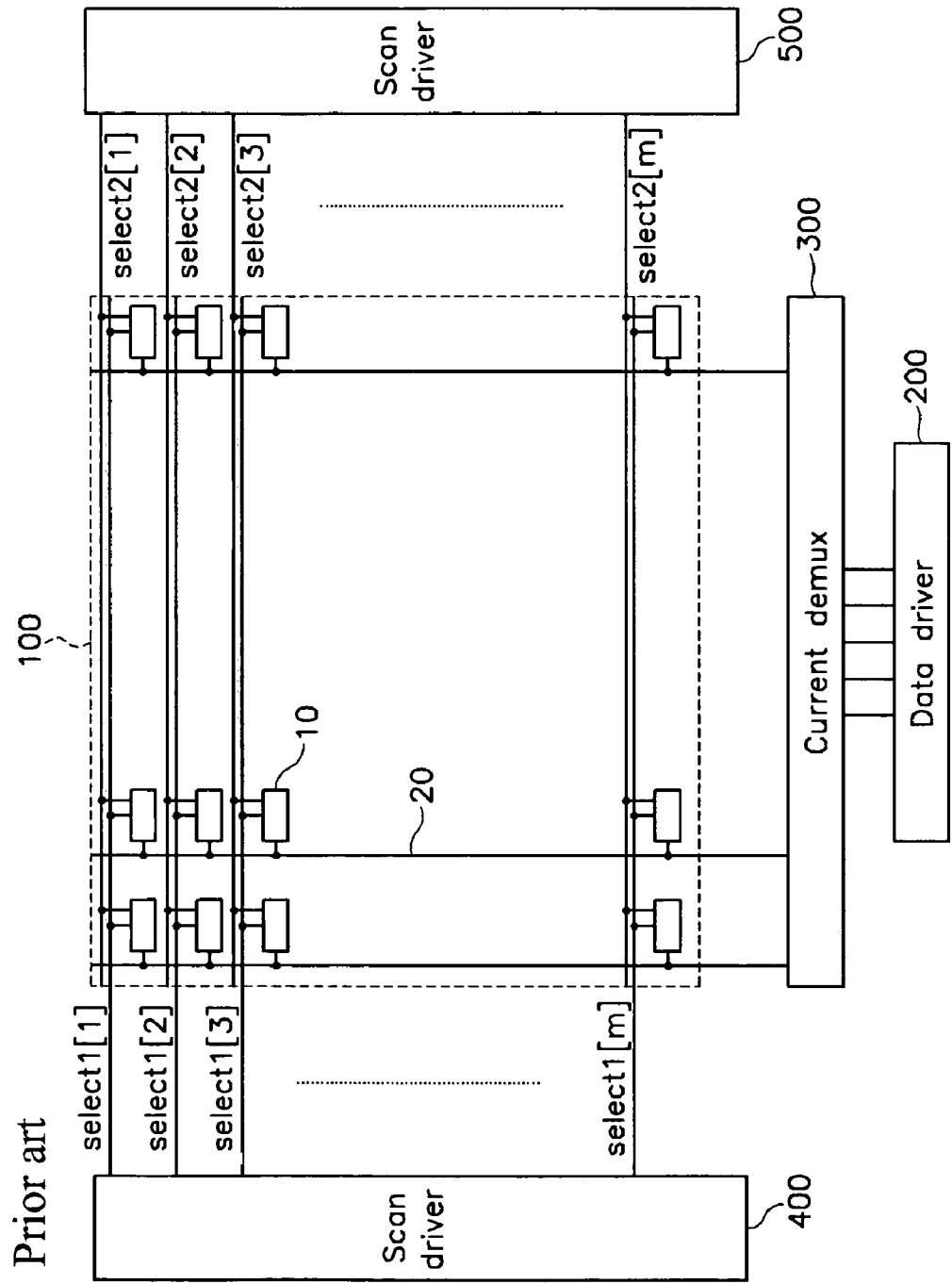
FIG. 1 shows an AMOLED display device as an example of a current driven display device which needs current demultiplexing, to which exemplary embodiments of the present invention can be applied.
Figure 2:
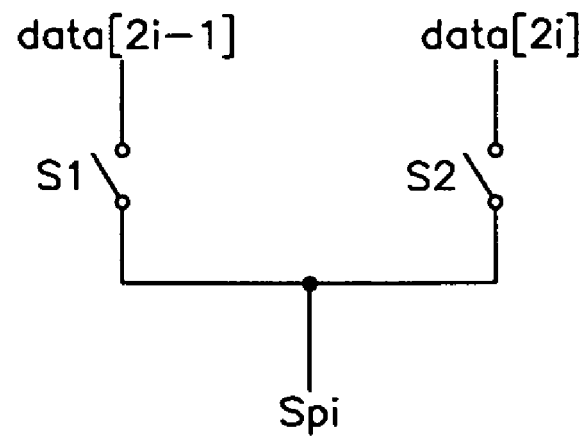
FIG. 2 shows a conventional analog switch for a demultiplexer.

In the following detailed description, only certain exemplary embodiments of the present invention are shown and described, simply by way of illustration. As those skilled in the art would realize, the described embodiments may be modified in various different ways, all without departing from the spirit or scope of the present invention. Accordingly, the drawings and description are to be regarded as illustrative in nature, and not restrictive.

In the context of the present application, to couple one thing to another refers to directly coupling a first thing to a second thing or to couple a first thing to a second thing with a third thing provided therebetween. In addition, to clarify the present invention, certain components which are not described in the specification can be omitted, and like reference numerals indicate like components.

Figure 3:
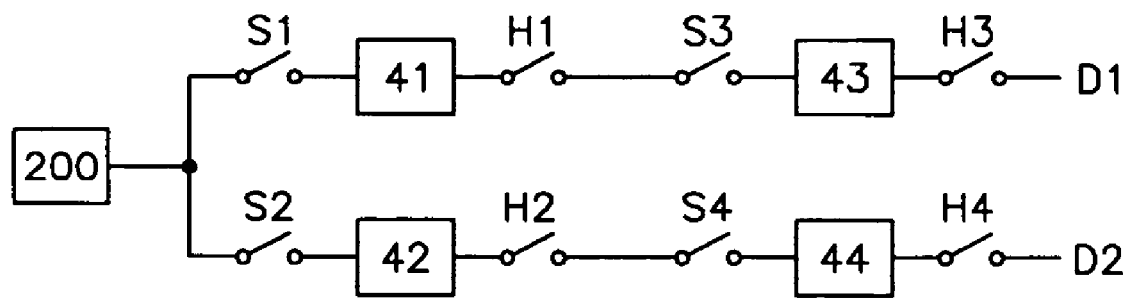
FIG. 3 shows a conceptual block diagram of a demultiplexer according to a first exemplary embodiment of the present invention.

FIG. 3 shows a conceptual block diagram of a demultiplexer according to a first exemplary embodiment of the present invention.

The demultiplexer shown in FIG. 3 uses four sample/hold circuits which include data storage units 41, 42, 43, and 44, sampling switches S1, S2, S3, and S4, and holding switches H1, H2, H3, and H4. The data storage units 41 and 42 are coupled to a data driver 200 through the sampling switches S1 and S2, and coupled to the second (or subsequent) part of the sample/hold circuits through the holding switches H1 and H2. Also, the data storage units 43 and 44 are coupled to the first (or previous) part of the sample/hold circuits through the sampling switches S3 and S4, and coupled to data lines D1 and D2 through the holding switches H3 and H4.

The first part of the sample/hold circuits (including the data storage units 41 and 42) alternately sample the data current which is time-divided and sequentially inputted, and concurrently hold the current which corresponds to the sampled data when its sampling operation is finished. In addition, the second part of the sample/hold circuits (including the data storage units 43 and 44) substantially concurrently sample the current held by the first part of the sample/hold circuits, and concurrently hold the data current to the data lines D1 and D2 when its sampling operation is finished.

The terminologies of "to sample" and "to hold" used in the specification are further described below.

The sample/hold operation includes an operation for sampling the current flowing through the input terminal and writing it in the data storage units 41, 42, 43, and 44 in a voltage format, a state for maintaining the written data and standing by (since the input switches and the output switches are turned off), and an operation for supplying the current of the data lines by using the values corresponding to the written data. Therefore, the above-noted stages are defined to be a "sampling" stage, a "standby" stage, and a "holding" stage for better clarification.

An internal configuration of the sample/hold circuit according to the first exemplary embodiment is further described below. Since the four sample/hold circuits (including the data storage units 41, 42, 43, and 44) are substantially similar, one sample/hold circuit is described hereinafter with references to FIGS. 4A and 4B.

Figure 4A:
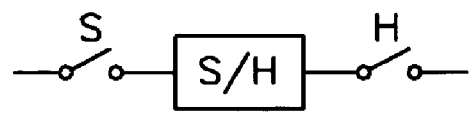
FIG. 4A shows a sample/hold circuit and a switch coupled to both terminals of a sample/hold circuit according to the first exemplary embodiment.
Figure 4B:
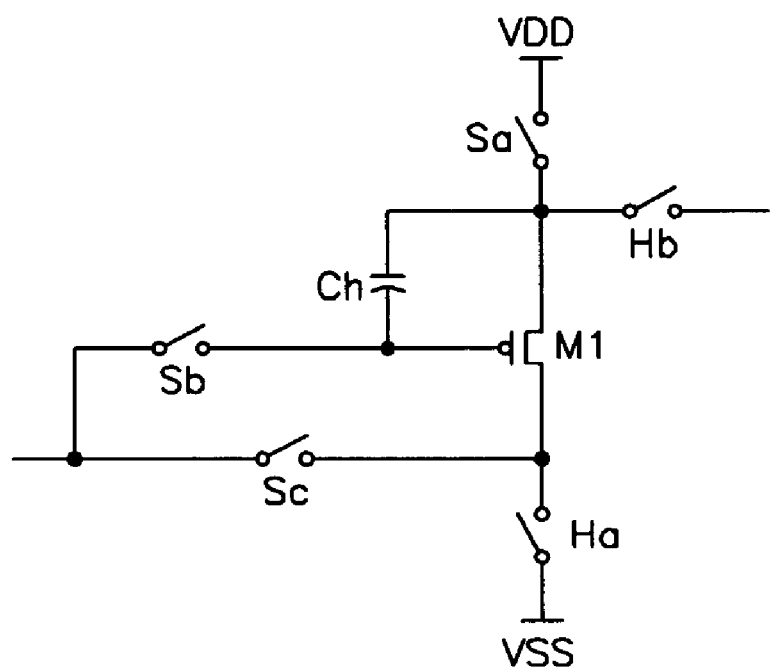
FIG. 4B shows an equivalent circuit of the circuit shown in FIG. 4A.

FIG. 4A shows a sample/hold circuit and a switch coupled to both terminals of the sample/hold circuit, and FIG. 4B shows an equivalent circuit of the circuit shown in FIG. 4A.

The sample/hold circuit of FIG. 4A includes a transistor M1, a capacitor Ch, sampling switches Sa, Sb, and Sc, and holding switches Ha and Hb as shown in FIG. 4B. A PMOS transistor or an NMOS transistor may be used as one or more of the switches, for example.

Referring now to FIG. 4B, the sampling switches Sa, Sb, and Sc substantially represent the switch S of FIG. 4A, and they are controlled by substantially the same (or similar) control signals. The holding switches Ha and Hb substantially represent a switch H of FIG. 4A, and they are controlled by substantially the same (or similar) control signals.

The sampling switch Sa is coupled between a power source VDD and a source of the transistor M1, and the holding switch Ha is coupled between a power source VSS and a drain of the transistor M1. A first terminal of the sampling switch Sb is coupled to a gate of the transistor M1, a second terminal thereof is coupled to a first terminal of the sampling switch Sc, and a second terminal of the sampling switch Sc is coupled to the drain of the transistor M1. Hence, the transistor M1 is diode-connected when the sampling switches Sb and Sc are turned on.

An operation of the sample/hold circuit is described below.

When the sampling switches Sa, Sb, and Sc are turned on and the holding switches Ha and Hb are turned off, the drain and the gate of the transistor M1 is coupled to form a diode connection; the current flows from the power source VDD to a data driver (e.g., the data driver 200 in FIG. 3) through the transistor M1. The capacitor Ch is charged with a gate-source voltage which corresponds to the current flowing through the transistor M1, and the sample/hold circuit shown in FIG. 4B performs a sampling operation of the data.

When the sampling switches Sa, Sb, and Sc, and holding switches Ha and Hb are turned off, the sample/hold circuit enters the standby stage while another sample/hold circuit (e.g., shown in FIG. 3) of the demultiplexer performs a sampling operation.

When the sampling switches Sa, Sb, and Sc are turned off and the holding switches Ha and Hb are turned on, the current which corresponds to the gate-source voltage charged in the capacitor Ch is maintained to flow to the drain from the source of the transistor M1. In this instance, the sample/hold circuit of FIG. 4B performs a holding operation and outputs the data.

FIG. 4B illustrates that the transistor M1 is realized with a p channel transistor (e.g., a PMOS transistor). The scope of the present invention, however, is not limited to the channel type of the transistor M1. Instead, the transistor M1 can be replaced by any suitable active element which has a first terminal, a second terminal, and a third terminal, and control the current flowing to the third terminal from the second terminal according to a voltage applied between the first and second terminals (e.g., a NMOS transistor) of course, those skilled in the art would recognize that the voltage polarities and levels may be different when other active elements are used.

Figure 5A:
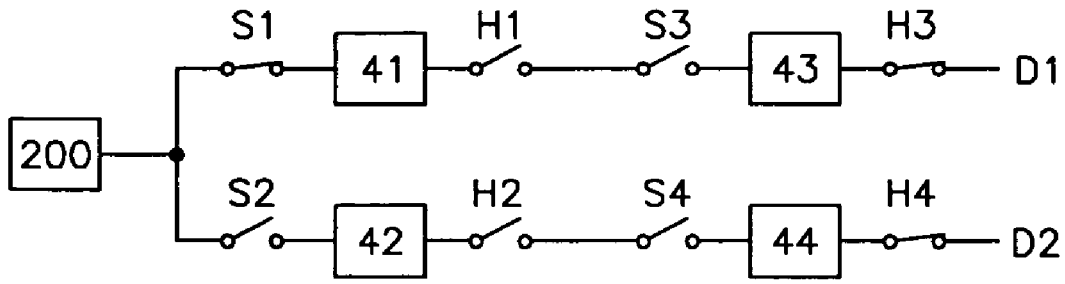
FIGS. 5A to 5C show a brief operation of the demultiplexer according to the first exemplary embodiment of the present invention.
Figure 5B:
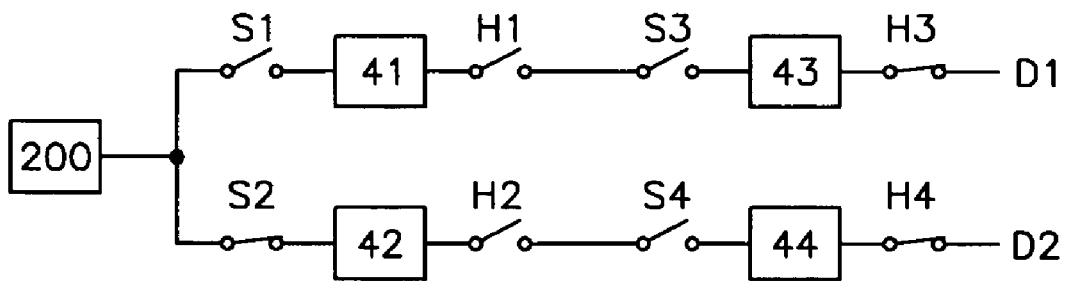
Figure 5C:
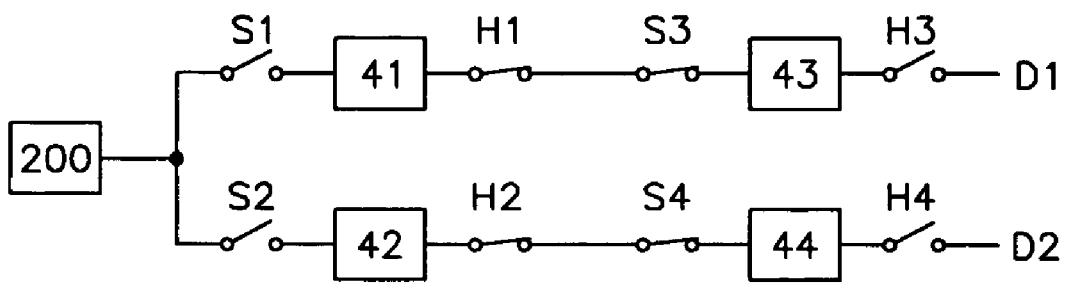
Figure 6:
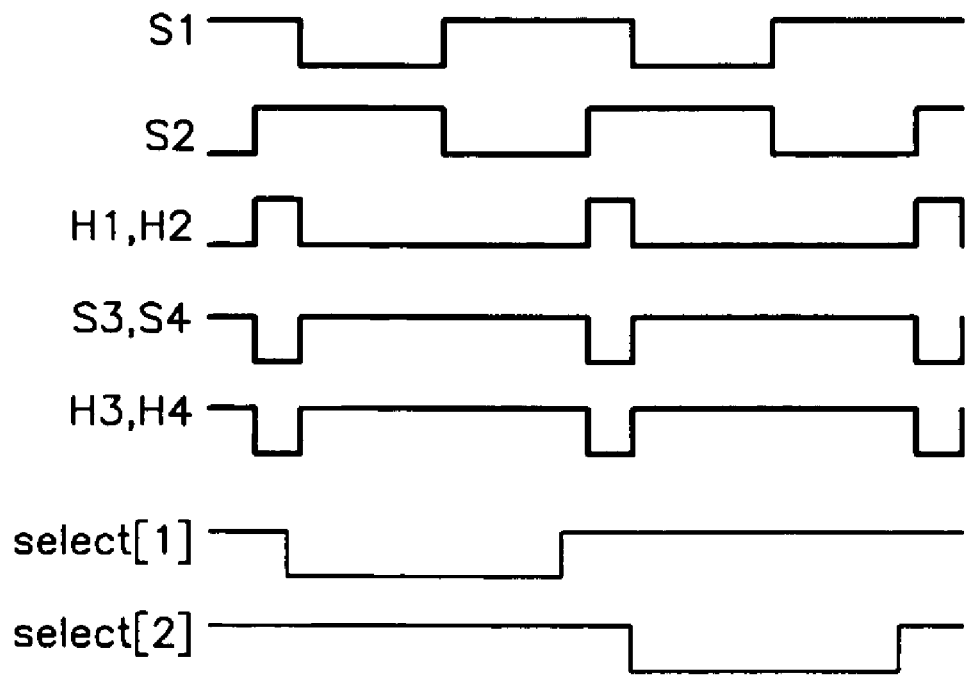
FIG. 6 shows a waveform of a control signal applied to the demultiplexer according to the first exemplary embodiment of the present invention.

FIGS. 5A to 5C show a brief operation of the demultiplexer according to the first exemplary embodiment of the present invention, and FIG. 6 shows a waveform of a control signal applied to the demultiplexer according to the first exemplary embodiment of the present invention. It is assumed in FIG. 6 that the sampling switches S1 S2, S3, and S4 are turned on when the applied control signal is low, and the holding switches H1, H2, H3, and H4 are turned on when the applied control signal is high.

In FIG. 5A, the holding switches H3 and H4 are turned on (i.e., closed) and the data storage units 43 and 44 supply the data current corresponding to the previously sampled and held data to the data lines D1 and D2. Further the sampling switch S1 is turned on (i.e., closed) and the data storage unit 41 performs a sampling operation.

In FIG. 5B, the sampling switch S1 is turned off (i.e., opened) such that the data storage unit 41 starts a standby stage in which the data corresponding to the sampled current is held, and the sampling switch S2 is turned on such that the data storage unit 42 performs a sampling operation. Since the holding switches H3 and H4 are still turned on, the above-noted data current supplying operation is still executed.

In FIG. 5C, the sampling switch S2 is turned off, and the holding switches H1 and H2 and the sampling switches S3 and S4 are turned on such that the current corresponding to the data sampled and held by the data storage units 41 and 42 is supplied, respectively, to the data storage units 43 and 44. Therefore, the data storage units 43 and 44 each perform a sampling operation, and since the holding switches H3 and H4 are turned off during the sampling operation, no current is programmed (i.e., supplied) to the data lines D1 and D2.

The demultiplexer according to the first exemplary embodiment of the present invention sequentially performs the operations of FIGS. 5A to 5C, and repeats the same operations.

In this case, since the data storage units 41 and 43 are directly coupled with each other, parasitic capacitance provided between the data storage units 41 and 43 is small enough such that it can be ignored, and, similarly, parasitic capacitance provided between the data storage units 42 and 44 is also small enough such that it can be ignored. Therefore, referring now to FIG. 6, since the time spent for the operation of FIG. 5C is very much less compared to the time for supplying the data current to data lines D1 and D2, (e.g., see FIG. 5A or 5B) no great influence is applied to the display device even when no data current (i.e., when H3 and H4 are turned off) is supplied to the data lines D1 and D2 during the performance of the operation of FIG. 5C. That is, using sample/hold circuits shown by the first exemplary embodiment of the present invention, the number of data drivers can be substantially reduced by a demultiplexer but the time for writing data on the pixels need not be substantially reduced.

Figure 7:
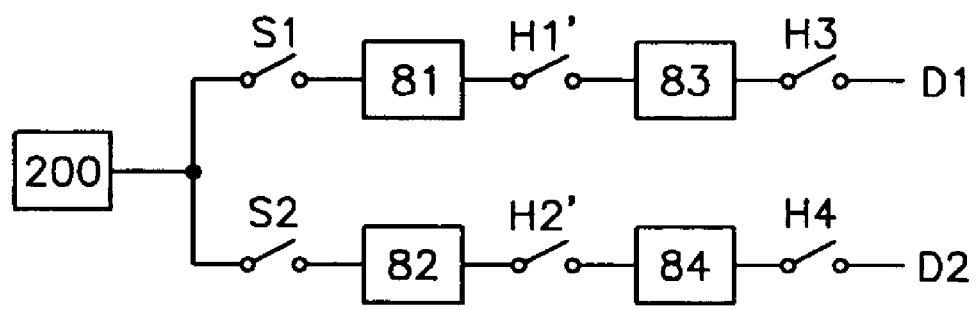
FIG. 7 shows a brief 1:2 demultiplexer according to a second exemplary embodiment of the present invention.
Figure 8:
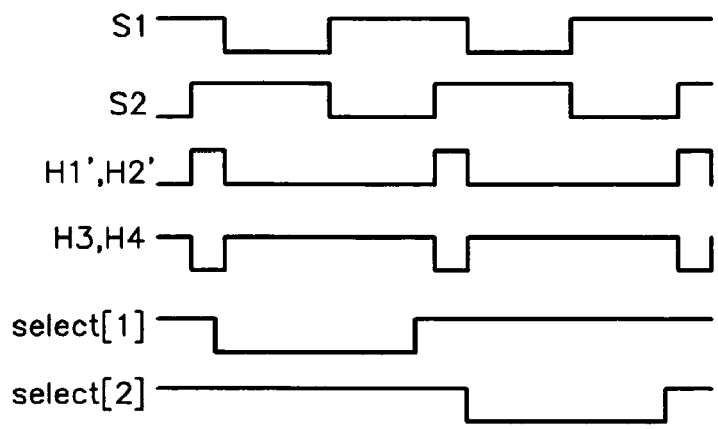
FIG. 8 shows a waveform of a control signal applied to the demultiplexer according to the second exemplary embodiment of the present invention.

FIG. 7 shows a brief 1:2 demultiplexer (or a demultiplexer for performing a 1:2 ratio demultiplexing) according to a second exemplary embodiment of the present invention, and FIG. 8 shows a waveform of a control signal applied to the demultiplexer according to the second exemplary embodiment of the present invention. It is assumed in FIG. 8 that the sampling switches S1 and S2 are turned on when the applied control signal is low, and the holding switches H1', H2', H3, and H4 are turned on when the applied control signal is high.

The demultiplexer according to the second exemplary embodiment uses holding switches H1' and H2' (instead of the holding switches H1, H2 and the sampling switches S3, S4 shown in FIG. 3) to couple data storage units 81 and 82, respectively, to data storage units 83 and 84.

In particular and referring back to FIGS. 5A, 5B, 5C and 6, since the sampling switches S3 and S4 are turned on when the control signal is low and, the holding switches H1 and H2 are turned off when the control signal is high, the sampling switches S3 and S4 and the holding switches H1 and H2 perform substantially concurrent on/off operations. Hence, in the second exemplary embodiment shown in FIG. 7, the holding switches H1' and H2' are used in place of the sampling switches S3 and S4 and the holding switches H1 and H2 shown in FIG. 3. The holding switches H1' and H2' can be realized with the holding switches H1 and H2 shown in FIG. 3, as well as other suitable switches.

An internal configuration of the demultiplexer according to the second exemplary embodiment is further described below.

Figure 9:
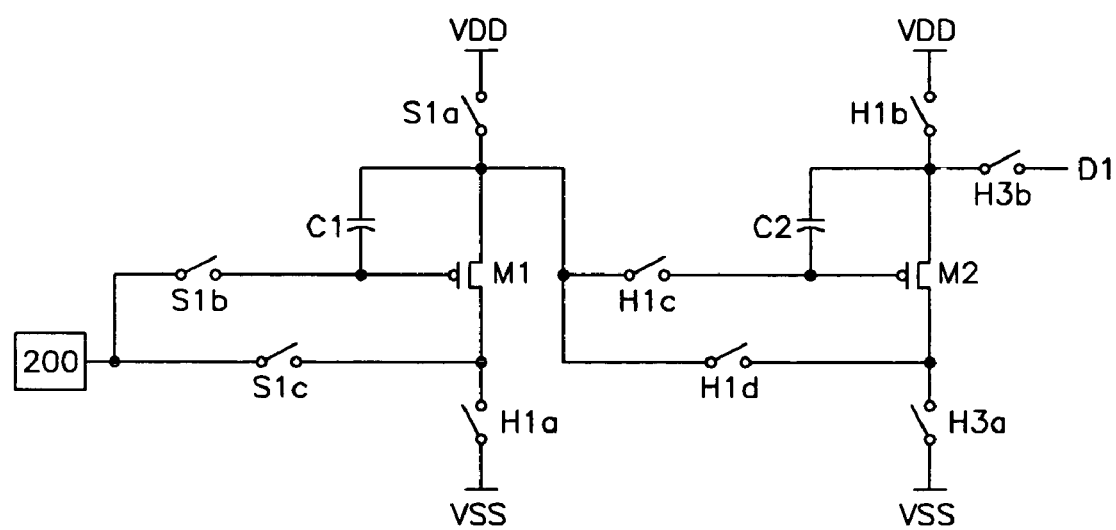
FIG. 9 shows an equivalent circuit of certain components of the circuit shown in FIG. 7.

FIG. 9 shows an equivalent circuit of the data storage units 81 and 83, the sampling switch S1 and the holding switches H1' and H3 of the demultiplexer shown in FIG. 7. In the context of the following discussion, the equivalent circuit of FIG. 9 is referred to as a sample/hold circuit.

The sample/hold circuit according to the second exemplary embodiment of the present invention includes transistors M1 and M2, capacitors C1 and C2, sampling switches S1a, S1b, and S1c, and holding switches H1a, H1b, H1c, H1d, H3a, and H3b.

The sampling switches S1a, S1b, and S1c substantially represent the switch S1 in FIG. 7, and they are controlled by substantially the same signals. Also, the holding switches H1a, H1b, H1c, and H1d substantially represent the switch H1', the holding switches H3a and H3b substantially represent the switch H3, and substantially the same control signals are applied thereto.

The sampling switch S1a is coupled between the power source VDD and the source of the transistor M1, and the holding switch H1a is coupled between the power source VSS and the drain of the transistor M1.

The sampling switch S1b is coupled between the gate of the transistor M1 and the data driver 200, the sampling switch S1c is coupled between the drain of the transistor M1 and the data driver 200, and the capacitor C1 is coupled between the gate and the source of the transistor M1.

Similarly, the holding switch H1b is coupled between the power source VDD and the source of the transistor M2, and the holding switch H3a is coupled between the power source VSS and the drain of the transistor M1.

The holding switch H1c is coupled between the gate of the transistor M2 and the source of the transistor M1, the holding switch H1*d* is coupled between the drain of the transistor M2 and the source of the transistor M1, and the capacitor C2 is coupled between the gate and the source of the transistor M2.

FIG. 9 illustrates that the transistors M1 and M2 are realized with p channel transistors (e.g., PMOS transistors). The scope of the present invention, however, is not limited to specific types of the transistors M1 and M2. Instead, the transistor M1 and/or the transistor M2 can be replaced by any suitable active element which has a first terminal, a second terminal, and a third terminal, and control the current flowing to the third terminal from the second terminal according to a voltage applied between the first and second terminals (e.g., NMOS transistors).

Further, an n channel transistor and/or a p channel transistor (e.g., an NMOS transistor and/or a PMOS transistor) may be used as one or more of the sampling switches S1*a*, S1*b*, and S1*c*, and the holding switches H1*a*, H1*b*, H1*c*, H1*d*, H3*a*, and H3*b*.

In another exemplary embodiment, the holding switch H1*a* can be realized with a transistor having a channel type which is different from that of the transistor M1, and the holding switch H1*b* can be realized with a transistor having the same channel type as that of the transistor M1. In this case, different control signals are used in order to concurrently turn on/off the holding switches H1*a* and H1*b* which form the switch H1. For example, the signals which correspond to the control signals for turning on/off the holding switches H3*a* and H3*b* can be used as the control signals for turning on/off the holding switch H1*b*.

Specifically, when the holding switch H1*a* is realized with an n channel transistor in the case where the transistor M1 is realized with a p channel transistor, a source of the holding switch H1*a* is coupled to the power source VSS, and a voltage level of the power source VDD can be used as a gate voltage for turning on the holding switch H1*a*. Further, the holding switch H1*a* is operated in the linear region, a drain-source voltage is less, and a voltage range of an available operational point is increased.

Similarly, when the holding switch H1*b* is realized with a p channel transistor, a source of the holding switch H1*b* is coupled to the power source VDD, and a voltage of the power source VSS can be used for a gate voltage for turning on the holding switch H1*b*. Further, the holding switch H1*b* is operated in the linear region, a drain-source voltage is less, and a voltage range of an available operational point is increased.

In view of the foregoing discussions, when the transistor M1 is realized with a p channel transistor and the holding switches H1*a* and H1*b* are, respectively, realized with an n channel transistor and a p channel transistor, different control signals are used to control turning on/off of the switches H1*a* and H1*b* Accordingly, the switches can be substantially concurrently turned on/off.

In a like manner, the switch H3*a* can be realized with an n channel transistor, and since the switches H1*a* and H3*a* are turned on in the opposite control signal levels and their turned on/off states are opposite with each other, they can be driven with the identical control signal.

For ease of description, the 1:2 demultiplexer has been described, but the scope of the present invention is not limited to this, and various modified 1:N demultiplexers can be realized that are within the spirit and scope of the present invention.

Also, while it has been described in FIGS. 5A to 5C (1) that the data storage unit 41 performs a sampling operation before a sampling operation of the data storage unit 42 and concurrently with the data storage units 43 and 44 supplying a data current corresponding to previously held data to the data lines D1 and D2 and (2) that the data storage unit 42 performs the subsequent sampling operation while the data storage units 43 and 44 are still supplying the data current corresponding to the previously held data to the data lines D1 and D2, the orders of the sampling operations can be modified and are still within the spirit and scope of the present invention. For example, the held data corresponding to the sampled data currents are varied according to the sampling orders, and vertical stripes are accordingly displayed on the display panel. By varying the sampling orders per frame or per sub-frame, substantially the same data currents can still on average be applied to the data lines. While this invention has been described in connection with certain exemplary embodiments, it is to be understood that the invention is not limited to the disclosed embodiments, but, on the contrary, is intended to cover various modifications and equivalents included within the spirit and scope of the appended claims, and equivalents thereof.

What is claimed is:

1. A demultiplexer for programming time-divided and sequentially input data currents to at least two signal lines, the demultiplexer comprising:

first and second sample/hold circuits for sequentially sampling data currents to hold corresponding sampled data; and third and fourth sample/hold circuits for respectively sampling the data held by the first and second sample/hold circuits, the third and fourth sample/hold circuits programming the data currents which correspond to the sampled data to the two signal lines, respectively, wherein at least one of the first, second, third, and fourth sample/hold circuits each comprises:

a transistor comprising a first terminal, a second terminal, and a third terminal, the first and second terminals controlling current flow to the third terminal from the second terminal according to a voltage difference between the first and second terminals;

a first switch for coupling a first power source to the second terminal of the transistor in response to a first control signal;

a second switch for transmitting a current to be sampled to the first terminal of the transistor in response to a second control signal;

a third switch for diode-connecting the transistor in response to a third control signal;

a capacitor coupled between the first and second terminals of the transistor, the capacitor for storing a voltage corresponding to the current to be sampled;

a fourth switch for coupling a second power source to the third terminal of the transistor in response to a fourth control signal; and a fifth switch for holding and supplying a current which corresponds to the voltage stored in the capacitor to the second terminal of the transistor in response to a fifth control signal.

2. The demultiplexer of claim 1, wherein the first, second, and third switches respond to a sampling operation and wherein the fourth and fifth switches respond to a holding operation.

3. The demultiplexer of claim 1, wherein the first, second, and third switches are realized with transistors having similar channel type and wherein the first, second and third control signals are substantially the same.

4. The demultiplexer of claim 1, wherein the fourth and fifth switches are realized with transistors having the same channel type and wherein the fourth and fifth control signals are substantially the same.

5. A demultiplexer for programming time-divided and sequentially input data currents to at least two signal lines, the demultiplexer comprising:

first and second sample/hold circuits for sequentially sampling data currents to hold corresponding sampled data; and third and fourth sample/hold circuits for respectively sampling the data held by the first and second sample/hold circuits, the third and fourth sample/hold circuits Programming the data currents which correspond to the sampled data to the two signal lines, respectively, wherein the first and second sample/hold circuits comprise a sampling switch, a holding switch, and a data storage unit coupled between the sampling switch and the holding switch, and one or both of the third and fourth sample/hold circuits each comprises:

a transistor comprising a first terminal, a second terminal, and a third terminal, and the first and second terminals controlling current flow to the third terminal from the second terminal according to a voltage difference between the first and second terminals;

a first switch for coupling a first power source to the second terminal of the transistor in response to a first control signal;

a second switch for transmitting a current to be sampled to the first terminal from the holding switch in response to a second control signal;

a third switch for diode-connecting the transistor in response to a third control signal;

a capacitor coupled between the first and second terminals of the transistor, the capacitor storing a voltage corresponding to the current to be sampled;

a fourth switch for coupling a second power source to the third terminal of the transistor in response to a fourth control signal; and a fifth switch for holding and supplying a current which corresponds to the voltage stored in the capacitor to the second terminal of the transistor in response to a fifth control signal.

6. The demultiplexer of claim 5, wherein one or both of the fourth and fifth switches are shared by at least one of the first, second, and third switches.

7. The demultiplexer of claim 5, wherein the fourth and fifth switches are realized with transistors having similar channel type, and the fourth and fifth control signals are substantially similar.

8. The demultiplexer of claim 5, wherein one or both of the fourth and fifth switches are realized with one or more second transistors having a channel type different from that of the transistor.

9. The demultiplexer of claim 5, wherein the first switch is realized with a second transistor having similar channel type as that of the transistor.

10. The demultiplexer of claim 5, wherein the fourth switch is realized with a second transistor having a channel type different from that of the transistor.

* * * * *

UNITED STATES PATENT AND TRADEMARK OFFICE
CERTIFICATE OF CORRECTION

PATENT NO. : 7,518,578 B2
APPLICATION NO. : 10/955171
DATED : April 14, 2009
INVENTOR(S) : Dong-Yong Shin et al.

It is certified that error appears in the above-identified patent and that said Letters Patent is hereby corrected as shown below:

On the Title Page

(73) Assignee          Delete "Samsung SDI Co., Ltd."

Insert -- Samsung Mobile Display Co. Ltd. --

In the Claims

Column 8, Claim 1, lines 22, 23     Delete "secquentially" Insert -- sequentially --

Column 9, Claim 5, line 13          Delete "Programming" Insert -- programming --

Signed and Sealed this
Third Day of May, 2011

David J. Kappos
*Director of the United States Patent and Trademark Office*